US011804454B2

(12) United States Patent
Hsu et al.

(10) Patent No.: US 11,804,454 B2
(45) Date of Patent: *Oct. 31, 2023

(54) PACKAGE-LEVEL NOISE FILTERING FOR EMI RFI MITIGATION

(71) Applicant: Tahoe Research, Ltd., Dublin (IE)

(72) Inventors: Hao-Han Hsu, Portland, OR (US); Dong-Ho Han, Beaverton, OR (US); Steven C. Wachtman, Portland, OR (US); Ryan K. Kuhlmann, Saint Helens, OR (US)

(73) Assignee: Tahoe Research, Ltd., Dublin (IE)

( * ) Notice: Subject to any disclaimer, the term of this patent is extended or adjusted under 35 U.S.C. 154(b) by 217 days.

This patent is subject to a terminal disclaimer.

(21) Appl. No.: 17/194,006

(22) Filed: Mar. 5, 2021

(65) Prior Publication Data

US 2021/0193598 A1 Jun. 24, 2021

Related U.S. Application Data

(63) Continuation of application No. 16/326,084, filed as application No. PCT/US2016/054556 on Sep. 29, 2016, now Pat. No. 10,991,665.

(51) Int. Cl.
*H01L 23/64* (2006.01)
*H01L 21/48* (2006.01)
(Continued)

(52) U.S. Cl.
CPC .......... *H01L 23/64* (2013.01); *H01L 21/4857* (2013.01); *H01L 23/49816* (2013.01);
(Continued)

(58) Field of Classification Search
CPC ............... H01L 21/4857; H01L 23/49822
See application file for complete search history.

(56) References Cited

U.S. PATENT DOCUMENTS

2006/0180905 A1 8/2006 Zeng et al.
2008/0179717 A1 7/2008 Wu
(Continued)

FOREIGN PATENT DOCUMENTS

KR 10-2013-0077565 7/2013

OTHER PUBLICATIONS

International Search Report and Written Opinion for International Patent Application No. PCT/US2016/054556 dated Jun. 26, 2017, 12 pgs.

(Continued)

*Primary Examiner* — Walter H Swanson
(74) *Attorney, Agent, or Firm* — Studebaker & Brackett PC

(57) ABSTRACT

A semiconductor package and a packaged electronic device are described. The semiconductor package has a foundation layer and a planar filtering circuit. The circuit is formed in the foundation layer to provide EMI/RFI mitigation. The circuit has one or more conductive traces that are patterned to form an equivalent circuit of inductors and capacitors. The one or more conductive traces include planar metal shapes, such as meanders, loops, inter-digital fingers, and patterned shapes, to reduce the z-height of the package. The packaged electronic device has a semiconductor die, a foundation layer, a motherboard, a package, and the circuit. The circuit removes undesirable interferences generated from the semiconductor die. The circuit has a z-height that is less than a z-height of solder balls used to attach the foundation layer to the motherboard. A method of forming a planar filtering circuit in a foundation layer is also described.

20 Claims, 9 Drawing Sheets

(51) Int. Cl.
   *H01L 23/498* (2006.01)
   *H01L 23/552* (2006.01)
   *H01P 1/20* (2006.01)

(52) U.S. Cl.
   CPC ...... *H01L 23/49822* (2013.01); *H01L 23/552* (2013.01); *H01P 1/20* (2013.01)

(56) References Cited

U.S. PATENT DOCUMENTS

| | | |
|---|---|---|
| 2012/0015485 A1 | 1/2012 | Kling et al. |
| 2012/0169432 A1 | 7/2012 | Rofougaran et al. |
| 2013/0223041 A1 | 8/2013 | Arnold et al. |
| 2016/0248517 A1* | 8/2016 | Parikh .................... H04B 10/58 |

OTHER PUBLICATIONS

International Preliminary Report on Patentability for International Patent Application No. PCT/US2016/054556 dated Apr. 11, 2019, 9 pgs.

\* cited by examiner

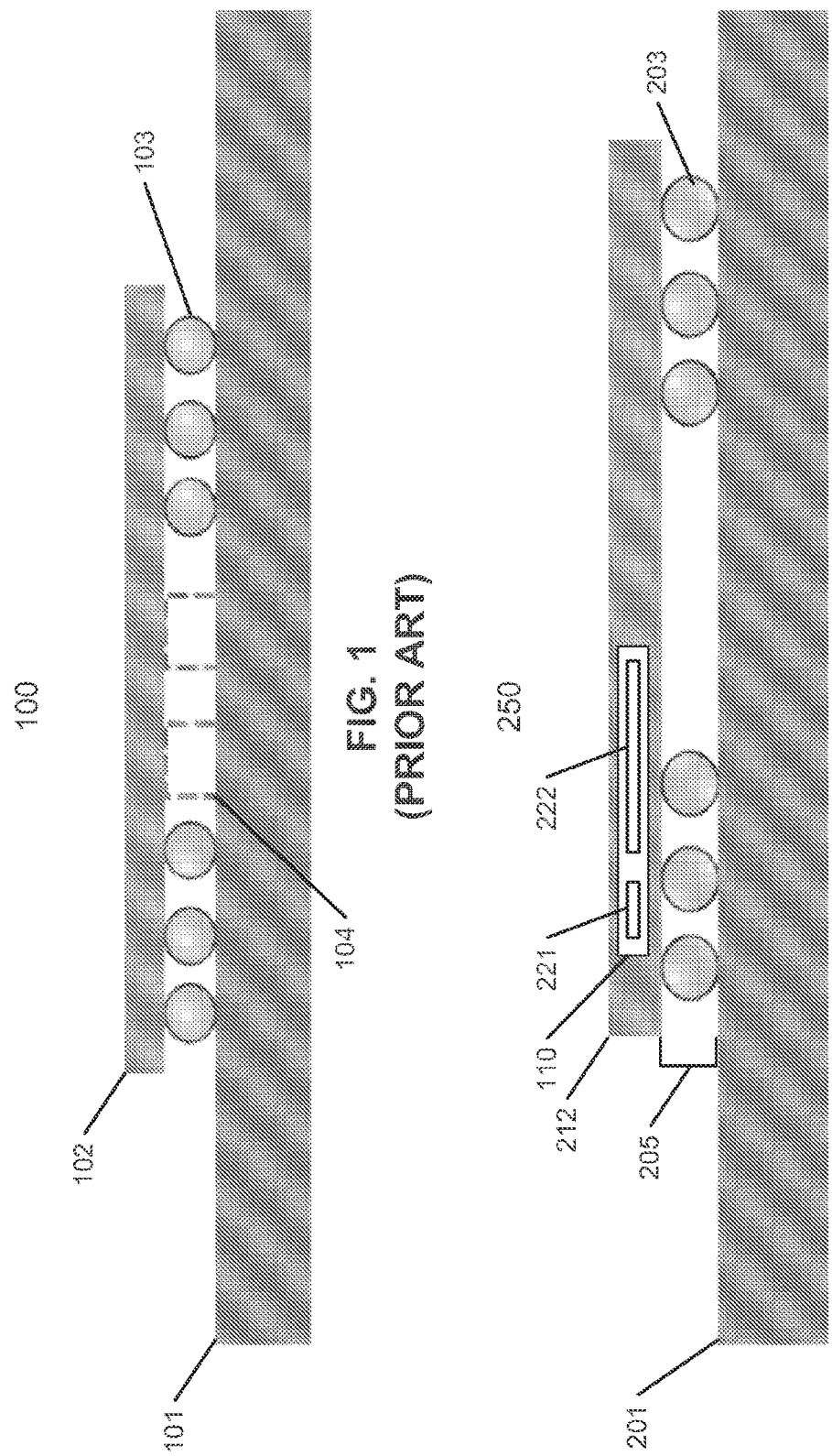

PACKAGE-LEVEL NOISE FILTERING FOR EMI RFI MITIGATION

CROSS-REFERENCE TO RELATED APPLICATION

This patent application is a Continuation of U.S. patent application Ser. No. 16/326,084, filed Feb. 15, 2019, which is a U.S. National Phase Application under 35 U.S.C. § 371 of International Application No. PCT/US2016/054556, filed Sep. 29, 2016, entitled "PACKAGE-LEVEL NOISE FILTERING FOR EMI RFI MITIGATION," which designates the United States of America, the entire disclosure of which is hereby incorporated by reference in its entirety and for all purposes.

FIELD

Embodiments relate to packaging for electronic devices. More particularly, the embodiments relate to packing solutions that include planar filtering circuits to provide electromagnetic interference (EMI) and radio frequency interference (RFI) mitigation.

BACKGROUND

Integrated circuits (ICs), such as central processing unit (CPUs), present several problems. One such problem is that the ICs generate high-frequency noise. High-frequency noise typically propagates through the package resulting in EMI and RFI. High-frequency might increase regulatory violations and degrade wireless performance.

As an effective approach, packaging solutions typically use filters comprising discrete components to reduce high-frequency noise. The drive to meet the need for miniaturization (or scaling down) of packages is, however, drastically decreasing the z-height of discrete components. This presents additional problems for packaging solutions, especially for discrete filter components, such as capacitors and inductors. FIG. 1 illustrates these problems.

FIG. 1 is a cross-sectional view of a typical semiconductor package and mother board assembly 100 that includes a typical filtering solution. As shown in FIG. 1, a typical semiconductor IC assembly 100 includes a motherboard 101, a foundation layer 102 (or a chip carrier package), solder balls 103, and one or more discrete filtering components 104, each of which can include land-side capacitor(s). Conventionally, the discrete filtering components 104 are used to suppress high-frequency noise. Discrete filtering components 104 are typically soldered on the top or bottom of the foundation layer 102, especially if using a land-side capacitor (LSC). The LSC 104, for example, is soldered on the bottom of the foundation layer 102 and lies between the foundation layer 102 and the motherboard 101. The solder balls 103 are typically used to attach the foundation layer 102 and the motherboard 101. To reduce overall height, the LSC 104 needs to be smaller than the z-height of the solder balls 103 but such LSCs might not be available. Increasing demands for the size reduction of the foundation layer 102 and the number of required solderballs 103 has been increasing. This trend drives finer pitch and shrunk solderballs, and the placement of conventional LSCs 104. In other words, if the z-height of the solder ball 103 is less than the z-height of the LSC 104 in a low-profile packaging that includes typical semiconductor package 100, the conventional approach of packaging solutions is inoperative and, therefore, cannot accommodate LSCs 104 to filter high-frequency noise of an IC.

Accordingly, there is a need to expand the current packaging solutions for components that effectively suppress EMI and RFI noise. Specifically, there is a need to form passive elements for mitigating noise on packages without increasing z-height, cost, and total number of discrete components.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 1 is a cross-sectional view of a typical semiconductor package that includes a typical filtering solution.

FIG. 2 is a cross-sectional view of a semiconductor package that includes a motherboard, a foundation layer, and a planar filtering circuit that further includes an inductor and a capacitor, according to one embodiment.

DETAILED DESCRIPTION

Figure 3:
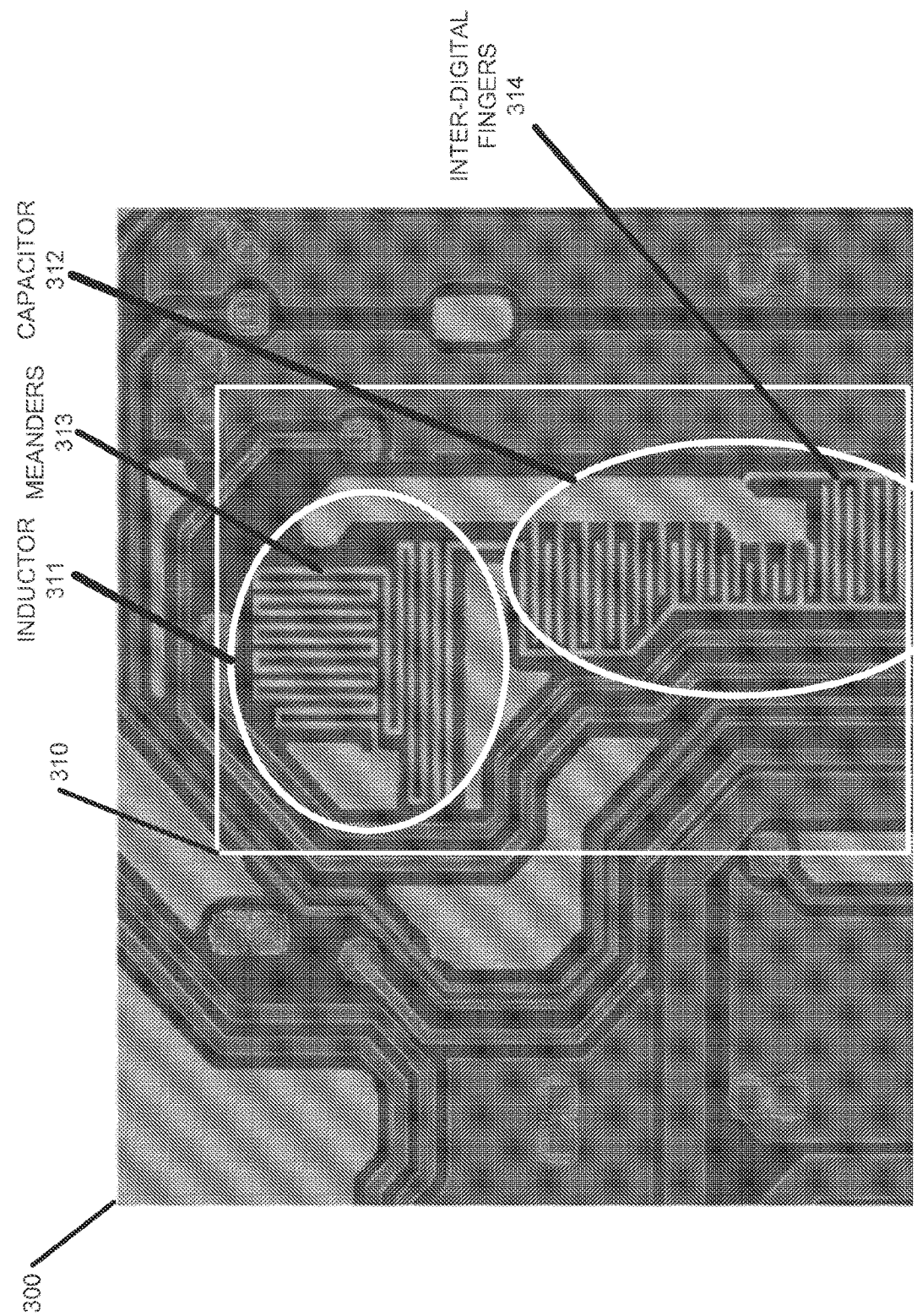
FIG. 3 is a plan view of a foundation layer that includes a planar filtering circuit of an inductor and a capacitor, according to one embodiment.

A semiconductor package is described herein that includes a planar filtering circuit to provide EMI and RFI mitigation. The planar filtering circuit is formed in a foundation layer. The planar filtering circuit includes one or more conductive traces that are patterned to form an equivalent circuit of inductors and capacitors.

Embodiments of the planar filtering circuit enhance packaging solutions. Embodiments of the planar filtering circuit help to enable noise filtering when a conventional discrete component, such as a land-side capacitor (LSC), is not feasible due to a z-height constraint. Embodiments of the planar filtering circuit help to implement passive elements to filter noise in the package without increasing z-height, cost, and total number of discrete components. Embodiments of the planar filtering circuit help to overcome the limitations on shrinking packages associated with the z-height of motherboards, discrete components, and solder balls.

FIG. 2 is a cross-sectional view of semiconductor package 250 that includes motherboard 201, foundation layer 212, and planar filtering circuit 110. Planar filtering circuit has inductor 221 and capacitor 222. As used herein, a "planar" filtering circuit refers to using planar metal shapes, such as meanders, loops, inter-digital fingers, and other patterned shapes, to form an equivalent filtering circuit of inductors and capacitors. Further, a "planar" filtering circuit may be formed in a single dielectric layer or multiple dielectric layers within a foundation layer. As used herein, a "foundation layer" refers to, but is not limited to, a motherboard, a printed circuit board (PCB), and a substrate. As used herein, a "z-height" refers to a unit of measurement on the z-axis in a three-dimensional package, which is usually oriented vertically.

Foundation layer 212 is mounted on motherboard 201. For one embodiment, foundation layer 212 is a PCB. For one embodiment, the PCB is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown).

Foundation layer 212 is patterned to form one or more conductive copper traces and pads (not shown) on the top and bottom of foundation layer 212. For some embodiments, holes (not shown) may be drilled in foundation layer 212. For one embodiment, motherboard 201 is also made of a multilayer PCB having conductive copper traces, metallic pads, and holes (not shown).

Foundation layer 212 is attached to motherboard 201 through the use of solder balls (or bumps) 203 that connect pads (not shown) on foundation layer 212 and motherboard 201. For example, solder balls 203 may be used on a ball grid array (BGA). Note that other methods of connectivity packaging may also be used such as pin grid array (PGA) or land grid array (LGA).

For one embodiment, solder balls 203 collapse to form z-height 205 as foundation layer 212 is mounted on motherboard 201. For another embodiment, z-height 205 is a measurement (on the z-axis) between foundation layer 212 and motherboard 201. Planar filtering circuit 110 is formed to have a z-height that is less than z-height 205 to overcome the z-height constraints associated with discrete filtering components.

Planar filtering circuit 110 is formed in foundation layer 212. For some embodiments, planar filtering circuit 110 may be formed on a single dielectric layer of foundation layer 212 or multiple dielectric layers of foundation layer 212. Planar filtering circuit 110 includes the one or more planar metal shapes to form an equivalent circuit of inductors 221 and capacitors 222, which is used to suppress EMI, RFI, and power noise. For certain embodiments, the one or more metal shapes may also be patterned to form an equivalent circuit of inductors, capacitors, and resistors (not shown). The one or more planar metal shapes have a negligible z-height compared to the z-height of discrete filtering components.

Inductors 221 and capacitors 222 are each formed using meanders, loops, and inter-digital fingers, or any combination therein (i.e., other patterned shapes), as illustrated in FIG. 3. Note that other planar patterned shapes may be formed. For one embodiment, inductors 221 and capacitors 222 are similar to the inductors and capacitors shown in FIGS. 4-5. The combination of inductors 221 and capacitors 222 is used to form planar filtering circuit 110.

Planar filtering circuit 110 is patterned using one or more planar metal shapes, such as meanders, loops, inter-digital fingers and other planar patterned shapes, as shown in FIG. 3. For example, foundation layer 300 of FIG. 3 shows that the planar metal shapes are formed on the same plane as foundation layer 300. Referring back to FIG. 2, the planar metal shapes (not shown) of planar filtering circuit 110 are formed on the same plane as foundation layer 212, rather than having a discrete component to increase the z-height constraints of z-height 205, solder balls 203, and semiconductor package 250. Having the z-height of semiconductor package 250, including L-height 205, mitigated with planar filtering circuit 110 is advantageous because no additional assembly or part(s) is required, and as such the manufacturing complexity and uncertainty is drastically reduced.

For certain embodiments, planar filtering circuit 110 is even more suitable for smaller form factors as the dimensions of the package and solder balls keep shrinking. Having planar filtering circuit 110 formed near a semiconductor die (not shown) rather than using discrete filtering components is advantageous because the proximity improves noise reduction as parasitic inductance generated by vias and routings is minimized.

Likewise, planar filtering circuit 110 also reduces the bill of materials (BoM) cost and assembly uncertainty for the high-frequency noise behavior. For example, planar filtering circuit 110 helps to facilitate shrinking and cost saving of the package by reducing the overall z-height of the package, while also enabling noise filtering when a discrete filtering component cannot be used due to a z-height constraint. Note that semiconductor package 250 may include fewer or additional packaging components based on the desired packaging design.

FIG. 3 is a plan view of foundation layer 300 that includes inductor 311 and capacitor 312. FIG. 3 also shows planar filtering circuit 310 formed on foundation layer 300. For one embodiment, foundation layer 300 has a low-profile packaging design that cannot accommodate LSCs due to a z-height constraint.

Foundation layer 300 is similar to foundation layer 212 of FIG. 2. Planar filtering circuit 310 is similar to planar filtering circuit of 110 of FIG. 2. For one embodiment, foundation layer 300 is a PCB. Planar filtering circuit 310 includes inductor 311 and capacitor 312 to form an equivalent circuit of inductor 311 and capacitor 312. The equivalent circuit of inductor 311 and capacitor 312 forms a LC filter to filter out EMI/RFI noise on foundation layer 300.

Inductor 311 and capacitor 312 are formed using meanders 313 and inter-digital fingers 314 respectively on foundation layer 300. Meanders 313 and inter-digital fingers 314 of planar filtering circuit 310 are combined to form conductive traces that are patterned to form an equivalent circuit of inductor 311 and capacitor 312.

Meander 313 are one or more conductive lines used to form inductor 311. Meander lines 313 have a lower inductance per unit area than, for example, a coil inductor. As shown in FIG. 3, meander lines 313 may have a plurality of turns to form inductor 311, depending on the required inductance. For another embodiment, loops (not shown) may also be used to form an equivalent circuit of inductors and capacitors. For example, the loops may be pattered to have one or more loops and turns to form an equivalent inductor and/or capacitor. For example, the inductance of a loop is defined by several parameter, for example, a diameter of a wire conductor, a diameter of a wire loop, and a number of turns.

Inter-digital fingers 314 (or interdigitated fingers) are one or more conductive lines used to form capacitor 312. Inter-digital fingers 314 are used to produce a capacitor-like, high pass characteristic using, for example, microstrip lines. The shape of inter-digital fingers 314 are defined by the parameters designed to mitigate a specified filtering noise. For example, long conductors or "fingers" provide coupling between an input and output ports across the gaps as shown in FIG. 3. Typically, the gaps between fingers and at the end of the fingers are the same, and the length and width of the fingers are also specified. Inter-digital fingers 314 are formed to provide a desired capacitance at a design frequency in a reasonable area. For some embodiments, the capacitance increases as the gaps of the inter-digital fingers 314 are decreased. Increasing the length of the inter-digital fingers 314 may also increase the capacitance, but increases the required board area of planar filtering circuit 310.

Figure 6:
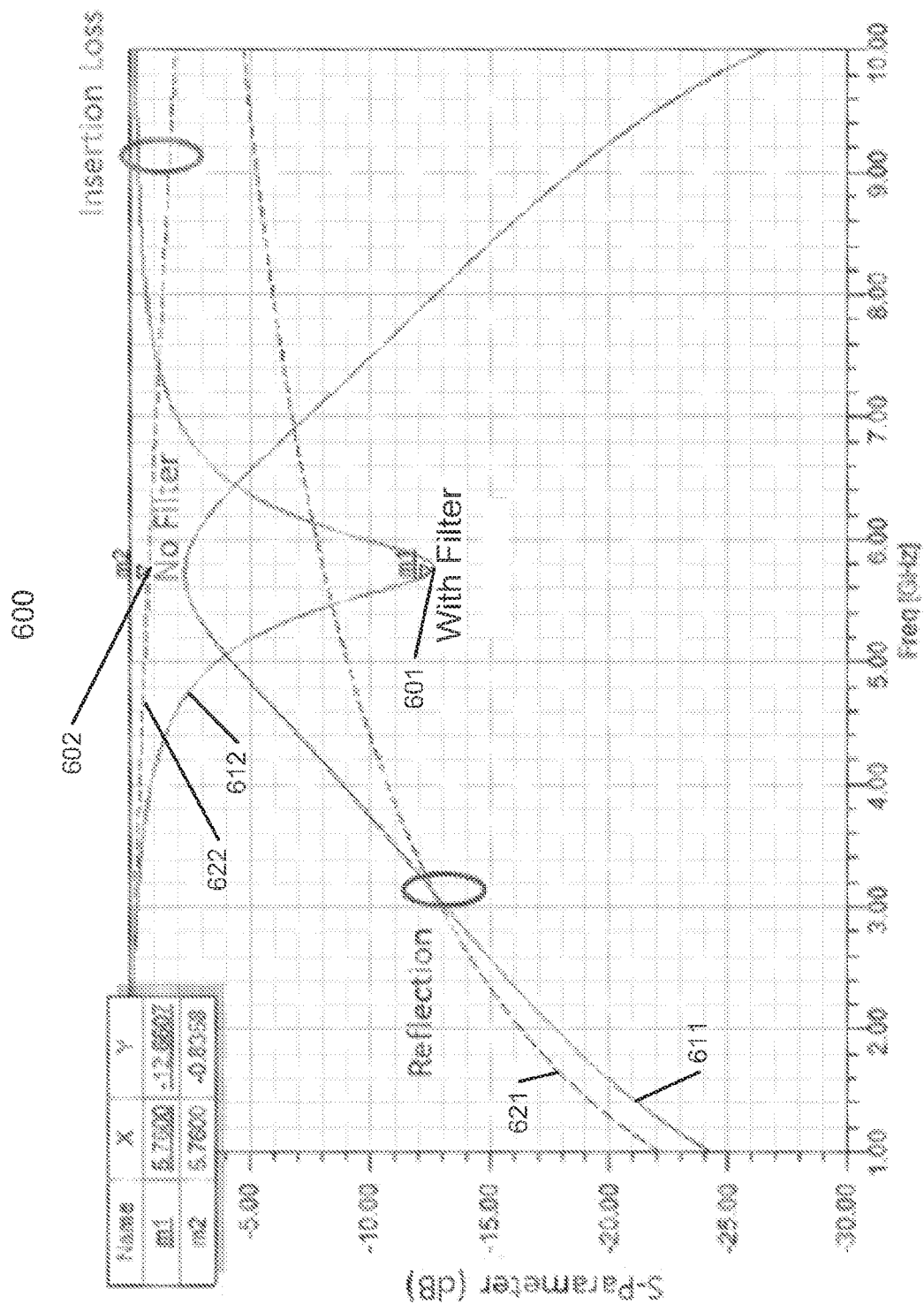
FIG. 6 is a graph illustrating a filtering notch using a planar filtering circuit, according to one embodiment.

For some embodiments, planar filtering circuit 310 can be used to generate signals at a particular frequency and to filter out a signal at a particular frequency (as shown in FIG. 6). For one embodiment, planar filtering circuit 310 can also be used as an electrical resonator that stores energy oscillating at the circuit's resonant frequency.

For certain embodiments, planar filtering circuit 300 can be used on a digital interface, a power plane, and any substrate that needs EMI/RFI mitigation. For another embodiment, planar metal shapes (e.g., meanders, loops, inter-digital fingers, and/or other shapes) may be combined to form various passive components, such as inductors, capacitors, resistors, and different types of filters. For one embodiment, planar filtering circuit 310 may be formed on a single dielectric layer of foundation layer 300 or multiple dielectric layers of foundation layer 300.

Figure 5:
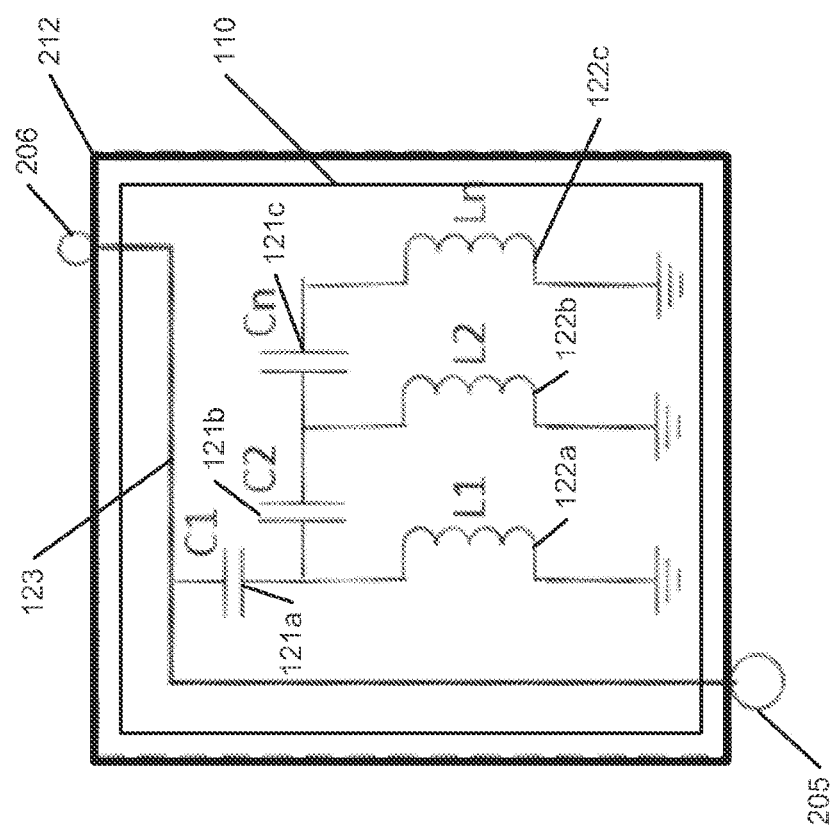
FIG. 5 is a partial cross-section schematic of a foundation layer that includes a planar filtering circuit in a parallel configuration, according to one embodiment.
Figure 4:
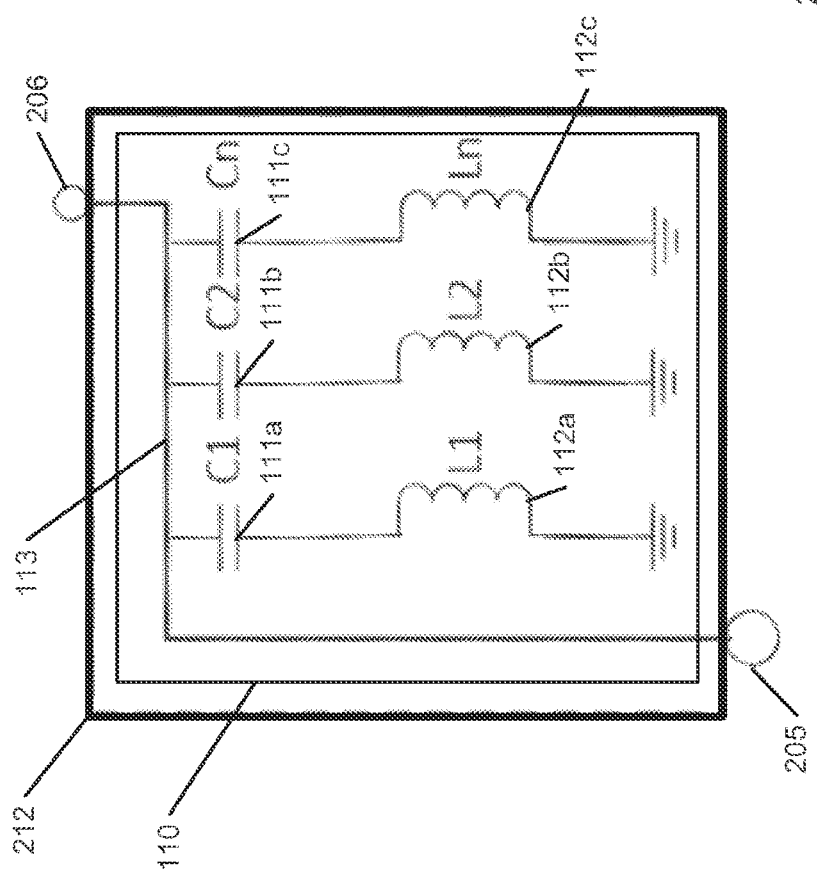
FIG. 4 is a partial cross-section schematic of a foundation layer that includes a planar filtering circuit in a series configuration, according to one embodiment.

FIGS. 4 and 5 illustrate that planar filtering circuit 110 can be connected in a series configuration, a parallel configuration, or any combination thereof. Note that each configuration may be used to suppress a particular interference (or frequency) of semiconductor package 250 of FIG. 2. Planar filtering circuit 110 is mounted on foundation layer 212 using solder balls 205 and 206 as shown in FIG. 1A. For certain embodiments, planar filtering circuit 110 can be mounted on a first dielectric layer (not shown) of foundation layer 212 in a series configuration as shown in FIG. 4; and planar filtering circuit 110 can also be mounted on a second dielectric layer (not shown) of foundation layer 212 in a parallel configuration as shown in FIG. 5. Likewise, in another embodiment, planar filtering circuit 110 may include one or more equivalent circuits of inductors and capacitors on a single layer (not shown) of foundation layer 212, where a first equivalent circuit (not shown) is in a series configuration and a second equivalent circuit (not shown) is in a parallel configuration.

FIG. 4 is a partial cross-sectional schematic view of foundation layer 212 that includes planar filtering circuit 110. FIG. 4 also shows a series configuration of a multipole LC filter formed on planar filtering circuit 110. The multipole LC filter has capacitors 111a-c ("C1, C2, and Cn") and inductors 112a-c ("L1, L2, and Ln") connected in series. Note that each of "Cn" and "Ln" refers to a total number "n" of capacitors and inductors, respectively.

For one embodiment, capacitors 111a-c are connected in series between input terminal 113 and inductors 112a-c. For one embodiment, inductors 112a-c are connected in series between capacitors 111a-c and the ground. For some embodiments, capacitors 111a-c may have the same or different capacitance, and inductors 112a-c may have the same or different inductance. Also note that the series LC filter of FIG. 4 may have one, two, three, or any number of poles that are needed to suppress noise at a specific frequency.

FIG. 5 is a partial cross-sectional schematic view of foundation layer 212 that includes planar filtering circuit 110. FIG. 5 also shows a parallel configuration of a multi-pole LC filter formed on planar filtering circuit 110. The multipole LC filter has capacitors 121a-c ("C1, C2, and Cn") and inductors 122a-c ("L1, L2, and Ln") connected in parallel. Note that each of "Cn" and "Ln" refers to a total number "n" of capacitors and inductors, respectively.

For one embodiment, capacitor 121a is connected between input terminal 123 and node 124a; capacitor 121b is connected between node 124a and node 124b; and capacitor 121c is connected between node 124b and inductor 122c. For one embodiment, inductor 122a is connected between node 124a and the ground; inductor 122b is connected between node 124b and the ground; and inductor 122c is connected between capacitor 121c and the ground. For some embodiments, capacitors 121a-c may have the same or different capacitance, and inductors 122a-c may have the same or different inductance. Also note that the parallel LC filter of FIG. 1C may have one, two, three, or any number of poles that are needed to suppress noise at a specific frequency.

FIG. 6 is a graph 600 illustrating filtering notch 601 using a planar filtering circuit as shown in FIG. 2. Graph 600 also shows a simulated parameter of noise reduction ("S-Parameter (dB)") versus a frequency range ("Freq [GHz]").

Graph 300 also compares filtering notch 601 (represented as solid lines "With Filter") versus filtering notch 602 (represented as dotted lines "No Filter"). Filtering notch 601 shows a filter (e.g., planar filtering circuit 110 of FIG. 2) that passes most frequencies unaltered, but attenuates some frequencies in a specific range to a lower level of noise with a narrow stop-band. For one embodiment, filtering notch 601 is used to remove, or greatly reduce, a signal from a local transmitter or a semiconductor die.

For one embodiment, planar filtering circuit 110 of FIG. 2 is used to mitigate noise at roughly 5.8 GHz. For one embodiment, the noise of planar filtering circuit 110 of FIG. 2 can be lowered by more than 10 dB (shown with filtering notch 601) as compared to the noise without a filtering circuit (shown with filtering notch 602).

Planar filtering circuit 110 of FIG. 2 is used to show filtering notch 601 and lines 611-612. For one embodiment, a foundation layer with no filtering circuit is used to show filtering notch 603 and lines 621-622. Additionally, graph 600 shows the insertion loss of filtering notches 601-602 at roughly 5.8 GHz.

Graph 600 also shows the insertion loss to illustrate the loss of signal power resulting from the insertion of planar filtering circuit 110 of FIG. 2 in a signal line (e.g., lines 612 and 622). For example, the insertion loss is defined as a ratio of the signal level 622 with no filter installed ("|m2|") to the signal level 612 with the filter installed ("|m1|"). Accordingly, graph 600 shows that the insertion loss is positive and measures how much smaller the signal is after using planar filter circuit 110 of FIG. 2.

Figure 7:
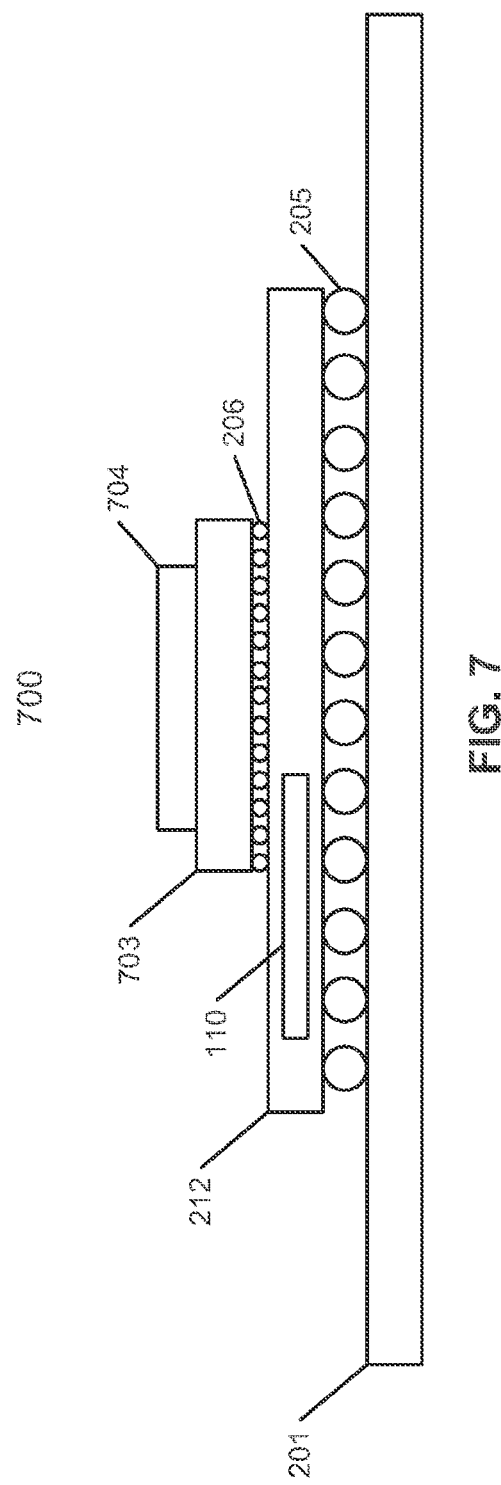
FIG. 7 is a cross-sectional view of a packaged electronic device that includes a semiconductor die, a motherboard, and a foundation layer that further includes a planar filtering circuit, according to one embodiment.

FIG. 7 illustrates a cross-sectional view of packaged electronic device 700 that includes motherboard 201, foundation layer 212, package 703, and semiconductor die 704. Foundation layer 212 resides between motherboard 201 and package 703. Package 703 includes semiconductor die 704.

For one embodiment, semiconductor die 704 includes, but not limited to, an integrated circuit, a CPU, a microprocessor, and a platform controller hub (PCH).

Planar filtering circuit 110 is formed in foundation layer 212 to remove one or more interferences (i.e., undesired interferences) generated by semiconductor die 704. Planar filtering circuit 110 includes one or more planar metal shapes to form an equivalent circuit of inductors and capacitors (or an equivalent circuit of inductors, capacitors, and resistors), having a negligible z-height compared to the z-height of discrete filtering components.

Foundation layer 212 is attached to motherboard 201 through the use of solder balls (or bumps) 205 that connect pads (not shown) on foundation layer 212 and motherboard 201. For example, solder balls 205 may be used on a BGA, a PGA, or a LGA. Package 703 is attached to foundation layer 212 through the use of solder balls (or controlled collapse chip connection (C4) bumps) 206 that connect pads (not shown) on package 703 and foundation layer 212.

For certain embodiments, planar filtering circuit 110 is even more suitable for smaller form factors as the dimensions of the package and solder balls keep shrinking. Having planar filtering circuit 110 formed near semiconductor die 704 rather than using discrete filtering components is advantageous because the proximity improves noise reduction as parasitic inductance generated by vias and routings is minimized. Note that packaged electronic device 700 may include fewer or additional packaging components based on the desired packaging design.

Figure 8:
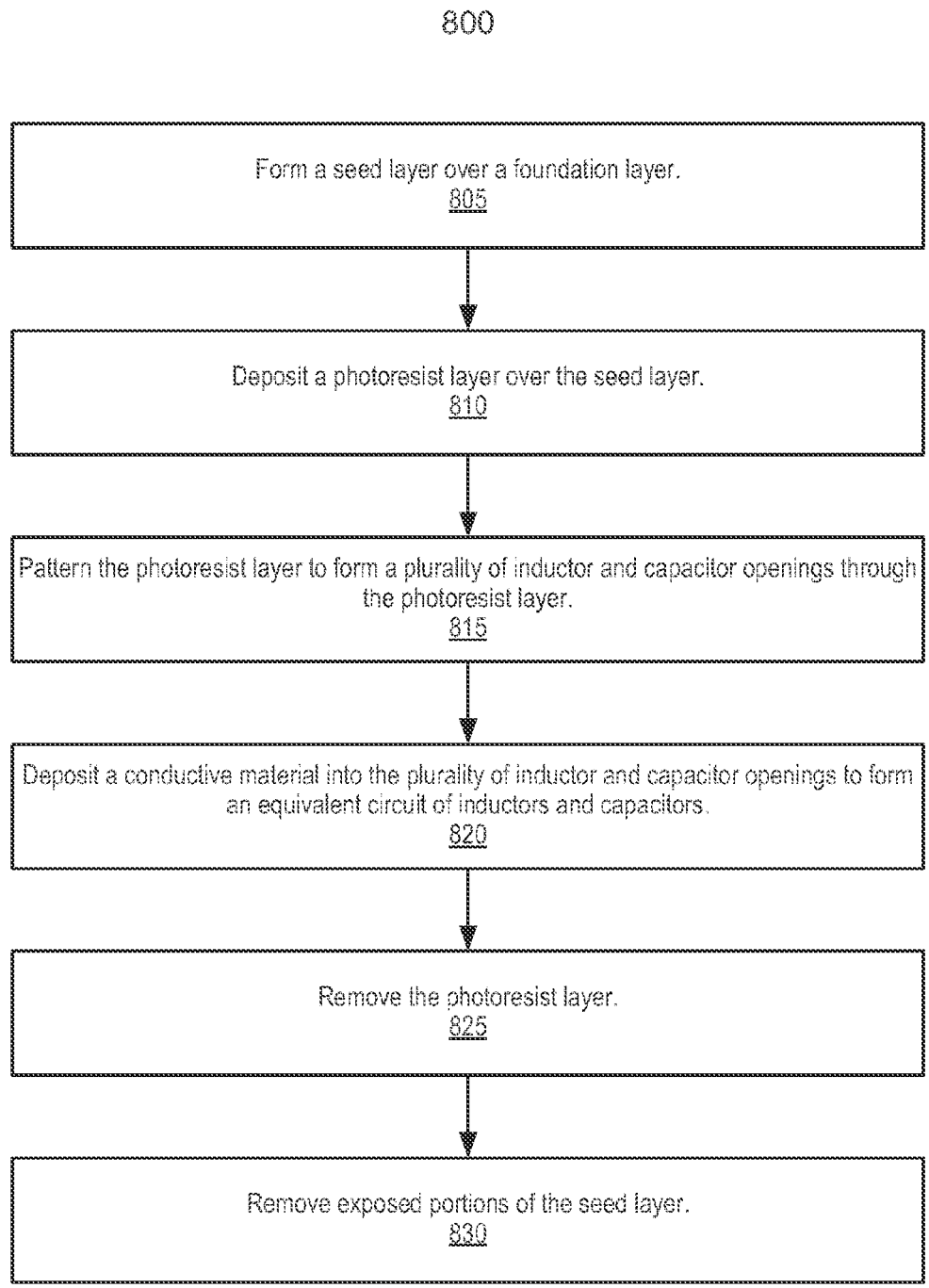
FIG. 8 is a process flow illustrating a method of forming a planar filtering circuit in a foundation layer, according to one embodiment.

FIG. 8 is a process flow 800 illustrating a method of forming a planar filtering circuit in a foundation layer. FIGS. 9-16 are cross-sectional view illustrations of the method of forming the planar filtering circuit in the foundation layer. Process flow 800 can be performed, but is not limited to, as a substrate patterning that is typically performed with semi-additive patterning (SAP). For another embodiment, process flow 800 can be performed with other patterning tools such as embedded tracing.

For one embodiment, process flow 800 includes processing steps to form the conductive traces and vias in each dielectric layer of the foundation layer (e.g., foundation layer 212 of FIG. 2, and foundation layer 300 of FIG. 3). Process flow 800 can be implemented to pattern, for example, planar filtering circuit 110 of FIG. 2 and planar filtering circuit 310 of FIG. 3.

Figure 9:
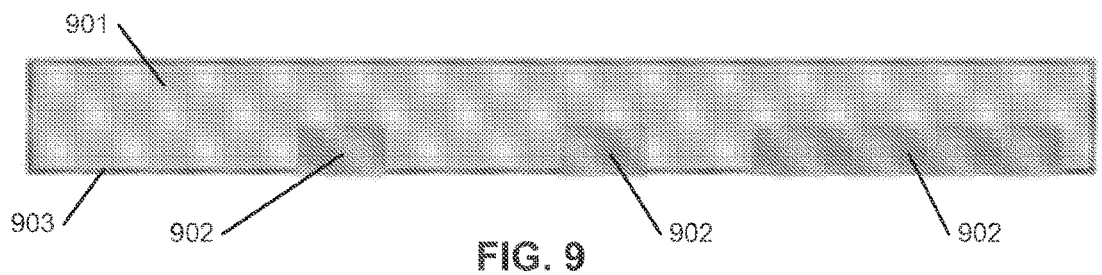
FIGS. 9-16 are cross-sectional view illustrations of a method of forming a planar filtering circuit in a foundation layer, according to one embodiment.

As shown in FIG. 9, dielectric layer material 901 is formed over lower layer 903 (also referred to as an existing layer). Lower layer 903 includes one or more conductive traces 902. For one embodiment, conductive traces 902 may be used to form an equivalent circuit of inductors and capacitors. For some embodiments, conductive traces 902 are patterned into a combination of at meanders, loops, inter-digital lingers, and/or patterned shapes (as shown in FIG. 3) to form an equivalent circuit of inductors and capacitors.

For one embodiment, dielectric layer 901 may be a polymer material, such as, for example, polyimide, epoxy or build-up film (BF). For another embodiment, dielectric layer 901 may be one layer in a stack that includes a plurality of dielectric layers used to form a foundation layer (or a build-up structure). As such, dielectric layer 901 may be formed over another dielectric layer. For certain embodiments, dielectric layer 901 may be formed as the first dielectric layer over a core material on which the stack is formed.

Figure 10:
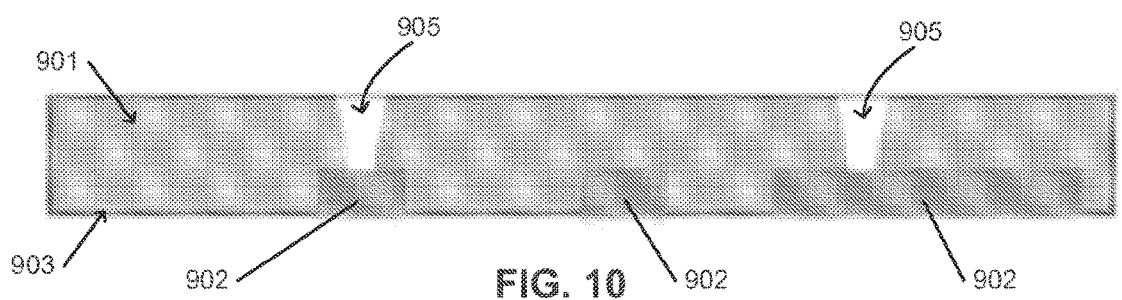

As shown in FIG. 10, via openings 905 are then etched through dielectric layer 901 to provide electrical connections to conductive traces 902 of lower layer 903. Via openings 905 may then be patterned into dielectric layer 901 by exposing dielectric layer 901 to radiation through a via layer mask (not shown) and developing with a developer. It is to be appreciated that only two via openings 905 are illustrated in FIG. 10 for simplicity, and that a plurality of via openings 905 may be patterned at the same time. For one embodiment, via openings 905 have substantially vertical sidewalls. It is to be appreciated that embodiments include sidewalls of via opening 905 that are not tapered, as is the case when laser drilling operations are used to form a via opening through a dielectric layer. As illustrated in the cross-sections view in FIG. 10, via openings 905 are substantially triangular. However, additional embodiments are not limited to such configurations. For example, via openings 905 may be circular, elongated, rectangular, or any other desired shape. According to one embodiment, one or more via openings 905 may be formed with different shapes and/or sizes. The use of lithography patterning to form via openings 905 allows for a plurality of sizes and shapes to be formed in a single patterning operation.

Figure 11:
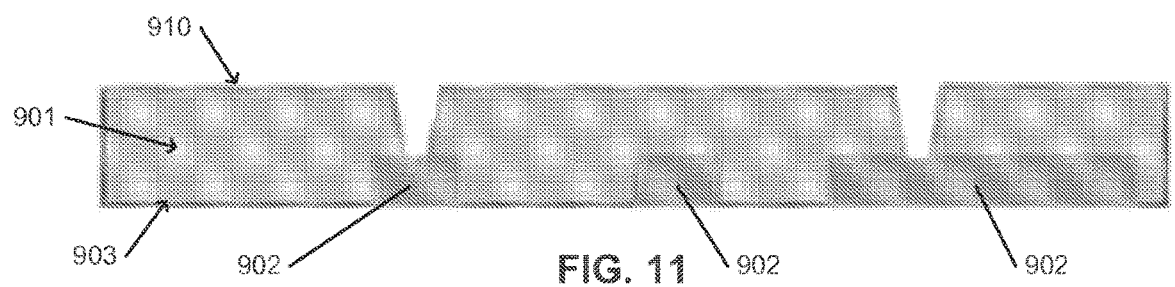

Referring now to FIG. 8, at block 805, processing flow forms a seed layer over a foundation layer. For example, as shown in FIG. 11, seed layer 910 is then deposited onto all exposed surfaces of dielectric layer 901. For one embodiment, seed layer 910 may be a copper seed layer.

Figure 12:
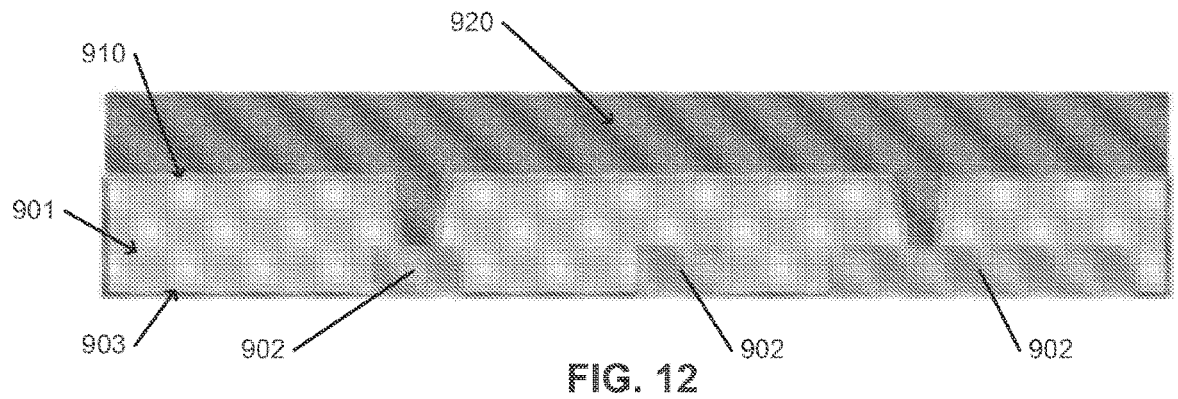

At block 810, processing flow deposits a photoresist layer over the seed layer. For one embodiment, as shown in FIG. 12, in order to prevent metal deposition across the entire surface of seed layer 210, photoresist layer 920 is formed over the exposed surfaces and then patterned.

Figure 13:
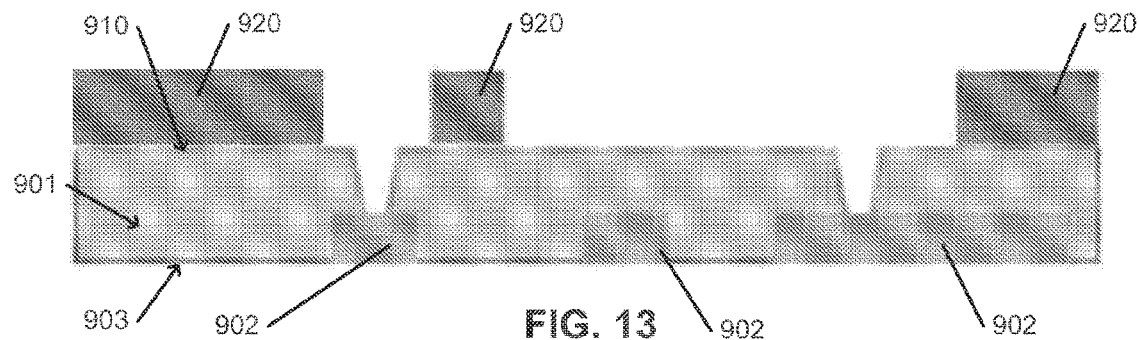

At block 815, processing flow patterns the photoresist layer to form a plurality of inductor and capacitor openings through the photoresist layer. For one embodiment, as shown in FIG. 13, the patterning exposes only regions 920 of the photoresist layer on which metal is desired, in order to form the conductive traces used to form an equivalent circuit of inductors and capacitors. For some embodiments, patterning of photoresist layer 920 may be implemented with lithographic processes (e.g., exposed with a radiation source through a routing layer mask (not shown) and developed with a developer).

Figure 14:
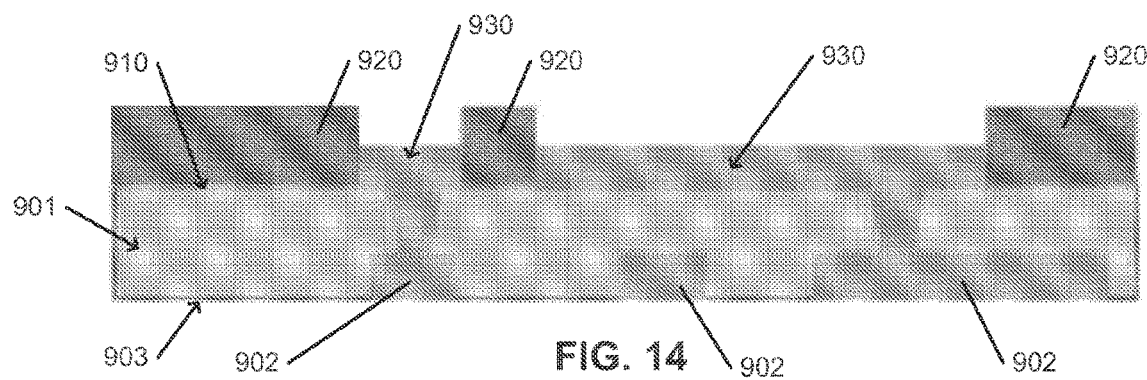

At block 820, processing flow deposits a conductive material into the plurality of inductor and capacitor openings to form the equivalent circuit of inductors and capacitors. For one embodiment, as shown in FIG. 14, electroless plating (or an electroplating process, or the like) is used to deposit metal material (or a conductive material) over exposed regions 920 to metalize the exposed surfaces 930 of dielectric layer 901. For some embodiments, the conductive material is used to form one or more conductive traces. For some embodiments, the one or more conductive traces are used to form planar metal shapes, such as meanders, loops, inter-digital fingers, and other patterned shapes.

Figure 15:
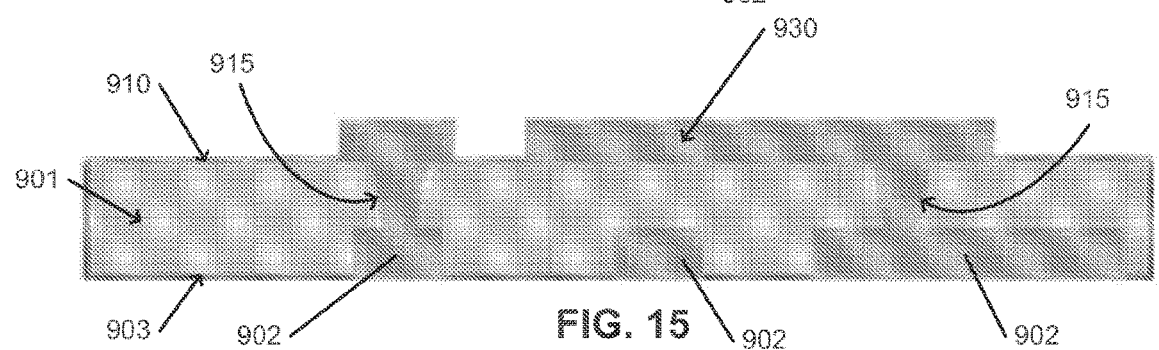
Figure 16:
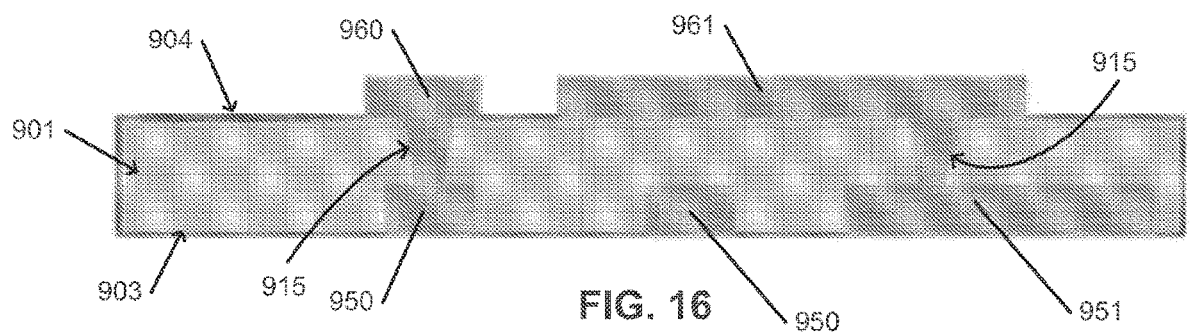

At block 825, processing flow removes the photoresist layer. As shown in FIG. 15, vias 915 are formed in via openings 905. For one embodiment, vias 915 may be formed with any suitable deposition process, such as electroplating, electroless plating, or the like. For another embodiment, after the processing flow removes the exposed photoresist layer 920, FIG. 15 illustrates that conductive traces 930 are now patterned and formed into a combination of one or more conductive inductor and capacitor lines (as shown in FIG. 16).

At block 830, processing flow removes exposed portions of the seed layer. For one embodiment, as shown in FIG. 16, seed layer 910 that was formed over the regions that were not metallized is removed, leaving second layer 904 that includes conductive traces 960-961. For one embodiment, seed layer 910 may be removed with a flash etching process. For one embodiment, FIG. 16 shows second layer 904 (or a layer of the foundation layer) that includes dielectric layer 901 between second layer 904 and lower layer 903, where layer 904 is a new layer formed over the existing layer 903. For some embodiments, conductive traces 950 and 960 are patterned to form equivalent inductor lines, which may be pattered as meanders, loops, inter-digital fingers, and/or other shapes. Likewise, for some embodiments, conductive traces 951 and 961 are patterned to form equivalent capacitor lines, which may be pattered as meanders, loops inter-digital fingers, and/or other shapes.

For one embodiment, inductor lines 960 may be similar to inductor 311 as shown in FIG. 3. Inductor lines 960 may be formed in the shape of meanders 313 shown in FIG. 3 to form inductor 311, according to one embodiment. For another embodiment, capacitor lines 961 may be similar to capacitor 312 as shown in FIG. 3. Capacitor lines 961 may be formed in the shape of inter-digital lingers 314 shown in FIG. 3 to form capacitor 312, according to one embodiment. For some embodiments, layer 903 may include one equivalent circuit of inductors and capacitors 950-951, and layer 904 may include another equivalent circuit of inductors and capacitors 960-961, where vias 915 are used to couple the one or more equivalent circuits of inductors and capacitors.

For some embodiments, the process flow may also pattern the photoresist layer to form a plurality of inductor, capacitor, and resistor openings through the photoresist layer, and then deposit the conductive material into the plurality of inductor, capacitor, and resistor openings to form an equivalent circuit of inductors, capacitors, and resistors.

For certain embodiments, the process flow mounts the foundation layer between a motherboard and a package. The foundation layer is then attached to the motherboard with solder balls shown in FIG. 2. For some embodiments, the process flow forms the planar filtering circuit to have a z-height that is less than a z-height of the solder balls, as illustrated in FIGS. 2 and 7.

Figure 17:
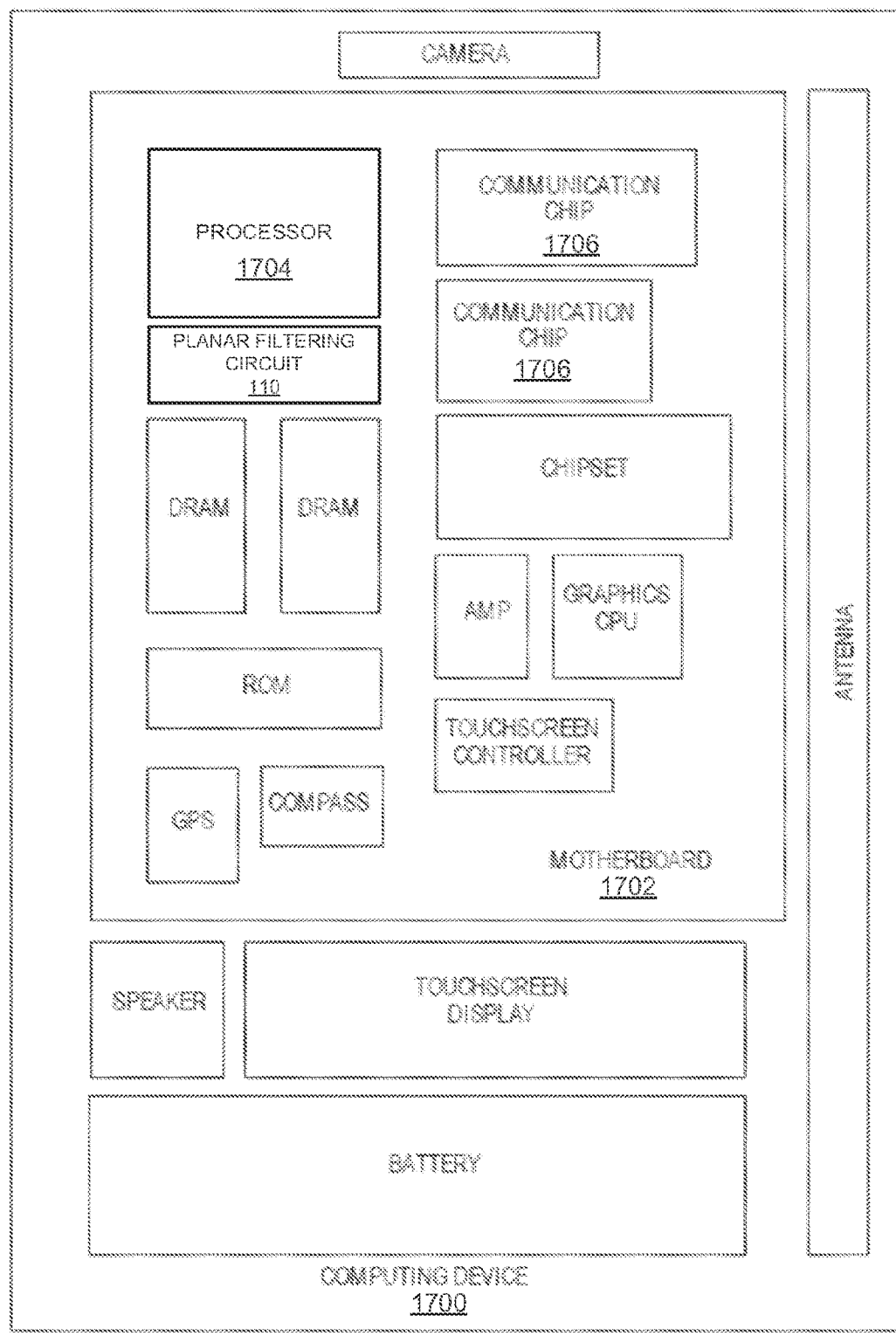
FIG. 17 is a schematic block diagram illustrating a computer system that utilizes a planar filtering circuit, according to one embodiment.

FIG. 17 illustrates an example of computing device 1700. Computing device 1700 houses motherboard 1702. For one embodiment, motherboard 1702 is similar to motherboard 201 of FIGS. 2 and 7. Motherboard 1702 may include a number of components, including but not limited to processor 1704, planar filtering circuit 110, and at least one communication chip 1706. Processor 1704 is physically and electrically coupled to motherboard 1702. For some embodiments, at least one communication chip 1706 is also physically and electrically coupled to motherboard 1702. For other embodiments, at least one communication chip 1706 is part of processor 1704.

Depending on its applications, computing device 1700 may include other components that may or may not be physically and electrically coupled to motherboard 1702. These other components include, but are not limited to, volatile memory (e.g., DRAM), non-volatile memory (e.g., ROM), flush memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DV D), and so forth).

At least one communication chip 1706 enables wireless communications for the transfer of data to and from computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 1706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1700 may include a plurality of communication chips 1706. For instance, a first communication chip 1706 may be dedicated to shorter range wireless communications such as Wi-Fi and Bluetooth and a second communication chip 1706 may be dedicated to longer range wireless communications such as GPS, EDGE, GPRS, CDMA, WiMAX, LTE, Ev-DO, and others.

Processor 1704 of computing device 1700 includes an integrated circuit die (e.g., semiconductor die 704 of FIG. 7) packaged within processor 1704. Planar filtering circuit 110 may be implemented near the integrated circuit die packaged within processor 1704 to minimize parasitic inductance generated by vias and routing. For certain embodiments, the integrated circuit die may be packaged with one or more devices on a foundation layer (or a package substrate) that includes a thermally stable RFIC and antenna for use with wireless communications and one or more planar filtering circuits, as described herein, to mitigate EMI/RFI noise. The term "processor" may refer to any device or portion of a device that processes electronic data from registers and/or memory to transform that electronic data into other electronic data that may be stored in registers and/or memory.

At least one communication chip 1706 also includes an integrated circuit die packaged within the communication chip 1706. For some embodiments, the integrated circuit die of the communication chip may be packaged with one or more devices on a foundation layer (or a package substrate) that includes one or more planar filtering circuits, as described herein, to mitigate EMI/RFI noise.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

For one embodiment, a semiconductor package includes a foundation layer and a planar filtering circuit formed in the foundation layer. The planar filtering circuit includes one or more conductive traces that are patterned to form an equivalent circuit of inductors and capacitors.

For another embodiment, the one or more conductive traces of the planar filtering circuit are patterned to form an equivalent circuit of inductors, capacitors, and resistors.

For another embodiment, the one or more conductive traces of the planar filtering circuit include at least one of meanders, loops, inter-digital fingers, and patterned shapes.

For another embodiment, the semiconductor package further includes a motherboard, a package, and a semiconductor die. The semiconductor die is mounted to the package.

For one embodiment, the foundation layer of the semiconductor package is mounted between the motherboard and the package. The foundation layer is attached to the motherboard with a plurality of solder balls.

For another embodiment, the planar filtering circuit has a z-height that is less than a z-height of the plurality of solder balls.

For another embodiment, the planar filtering circuit is formed on one or more dielectric layers of the foundation layer of the semiconductor package For one embodiment, each of the one or more dielectric layers of the foundation layer comprises a polymer material.

For another embodiment, the planar filtering circuit of the semiconductor package is configured to suppress at least one of an electromagnetic interference and a radio frequency interference.

For one embodiment, the foundation layer of the semiconductor package is a printed circuit board.

For another embodiment, a packaged electronic device includes a semiconductor die mounted to a package. The semiconductor die generates an interference. A foundation layer mounted between a motherboard and the package. A planar filtering circuit formed in the foundation layer. The planar filtering circuit includes one or more conductive traces that are patterned to form an equivalent circuit of inductors and capacitors that provide removes one or more interferences generated by semiconductor die.

For one embodiment, the one or more conductive traces of the planar filtering circuit are patterned to form an equivalent circuit of inductors, capacitors, and resistors.

For one embodiment, the one or more conductive traces of the planar filtering circuit include at least one of meanders, loops, inter-digital fingers, and pattered shapes.

For another embodiment, the semiconductor die of the packaged electronic device is an integrated circuit.

For another embodiment, the foundation layer of the packaged electronic device is attached to the motherboard with a plurality of solder balls.

For one embodiment, the planar filtering circuit of the packaged electronic device has a z-height that is less than a z-height of the plurality of solder balls.

For another embodiment, the planar filtering circuit of the packaged electronic device is formed on one or more dielectric layers of the foundation layer.

For one embodiment, each of the one or more dielectric layers of the foundation layer comprises a polymer material.

For another embodiment, the planar filtering circuit of the packaged electronic device is configured to suppress the interference. The interference comprises at least one of an electromagnetic interference and a radio frequency interference.

For another embodiment, the foundation layer of the packaged electronic device is a printed circuit board.

For one embodiment, a method of forming a planar filtering circuit in a foundation layer is described. The method includes forming a seed layer over the foundation layer. The method also includes depositing a photoresist layer over the seed layer. The method further includes patterning the photoresist layer to form a plurality of inductor and capacitor openings through the photoresist layer. The method includes depositing a conductive material into the plurality of inductor and capacitor openings to form an equivalent circuit of inductors and capacitors. The method further includes removing the photoresist layer and removing exposed portions of the seed layer.

For another embodiment, the method of forming the planar filtering circuit in the foundation layer further includes patterning the photoresist layer to form a plurality of inductor, capacitor, and resistor openings through the photoresist layer. The method further includes depositing the conductive material into the plurality of inductor, capacitor, and resistor openings to form an equivalent circuit of inductors, capacitors, and resistors.

For one embodiment, the conductive material of the method includes one or more conductive traces. The one or more conductive traces also include at least one of meanders, loops, inter-digital fingers, and pattered shapes.

For another embodiment, the foundation layer of the method is mounted between a motherboard and a package. The foundation layer is attached to the motherboard with a plurality of solder balls.

For another embodiment, the planar filtering circuit of the method has a z-height that is less than a z-height of the plurality of solder balls.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a multilayer substrate comprising a dielectric layer and a metal layer; and
   a circuit in the multilayer substrate, wherein the circuit includes one or more conductive traces in the metal layer, a capacitor in the metal layer, and an inductor in the metal layer, wherein one of the conductive traces is continuous with the capacitor and the inductor.

2. The semiconductor package of claim 1, wherein the circuit further comprises a resistor.

3. The semiconductor package of claim 1, wherein the one or more conductive traces comprise at least one of a meander, a loop, inter-digital fingers, or a patterned shape.

4. The semiconductor package of claim 1, wherein the circuit is configured to suppress an electromagnetic interference and a radio frequency interference.

5. The semiconductor package of claim 1, wherein the multilayer substrate is a printed circuit board.

6. The semiconductor package of claim 1, wherein the circuit is formed on the dielectric layer of the multilayer substrate.

7. The semiconductor package of claim 6, wherein the dielectric layer comprises a polymer material.

8. The semiconductor package of claim 1, further comprising a motherboard, a package, and a semiconductor die, wherein the semiconductor die is mounted to the package.

9. The semiconductor package of claim 8, wherein the multilayer substrate is mounted between the motherboard and the package, and wherein the multilayer substrate is attached to the motherboard with a plurality of solder balls.

10. The semiconductor package of claim 9, wherein the circuit comprises a z-height that is less than a z-height of the plurality of solder balls.

11. A packaged electronic device, comprising:
a semiconductor die mounted to a package, wherein the semiconductor die generates an interference;
a multilayer substrate mounted between a motherboard and the package, the multilayer substrate comprising a dielectric layer and a metal layer; and
a circuit in the multilayer substrate, wherein the circuit includes one or more conductive traces in the metal layer, a capacitor in the metal layer, and an inductor in the metal layer, wherein one of the conductive traces is continuous with the capacitor and the inductor.

12. The packaged electronic device of claim 11, wherein the circuit further comprises a resistor.

13. The packaged electronic device of claim 11, wherein the one or more conductive traces comprise at least one of a meander, a loop, inter-digital fingers, or a patterned shape.

14. The packaged electronic device of claim 11, wherein the circuit is configured to suppress the interference, and wherein the interference comprises at least one of an electromagnetic interference and a radio frequency interference.

15. The packaged electronic device of claim 11, wherein the multilayer substrate is a printed circuit board.

16. The packaged electronic device of claim 11, wherein the circuit is formed on the dielectric layer of the multilayer substrate.

17. The packaged electronic device of claim 16, wherein the dielectric layer comprises a polymer material.

18. The packaged electronic device of claim 11, wherein the semiconductor die comprises an integrated circuit.

19. The packaged electronic device of claim 18, wherein the multilayer substrate is attached to the motherboard with a plurality of solder balls.

20. The packaged electronic device of claim 19, wherein the circuit comprises a z-height that is less than a z-height of the plurality of solder balls.

* * * * *